United States Patent
Cobb

(10) Patent No.: US 11,984,640 B2
(45) Date of Patent: May 14, 2024

(54) ELECTRONIC CIRCUIT TO GENERATE A DC VOLTAGE FROM A WIRELESS SIGNAL AND METHOD OF MANUFACTURE

(71) Applicant: PRAGMATIC PRINTING LTD., Sedgefield (GB)

(72) Inventor: Brian Cobb, Sedgefield (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 418 days.

(21) Appl. No.: 17/274,237

(22) PCT Filed: Sep. 10, 2019

(86) PCT No.: PCT/GB2019/052524
§ 371 (c)(1),
(2) Date: Mar. 8, 2021

(87) PCT Pub. No.: WO2020/053574
PCT Pub. Date: Mar. 19, 2020

(65) Prior Publication Data
US 2021/0335710 A1  Oct. 28, 2021

(30) Foreign Application Priority Data
Sep. 10, 2018 (GB) ..................... 1814677

(51) Int. Cl.
*H01L 23/522* (2006.01)
*H01L 23/528* (2006.01)
(Continued)

(52) U.S. Cl.
CPC ....... *H01Q 1/2208* (2013.01); *H01L 23/5223* (2013.01); *H01L 23/5286* (2013.01);
(Continued)

(58) Field of Classification Search
CPC .......... H01L 29/786; H05K 3/36; H05K 3/46; H01Q 1/2208
See application file for complete search history.

(56) References Cited

U.S. PATENT DOCUMENTS

| | | | |
|---|---|---|---|
| 5,202,751 | A | 4/1993 | Horiguchi |
| 6,173,899 | B1 | 1/2001 | Rozin |
| | | (Continued) | |

FOREIGN PATENT DOCUMENTS

| | | | |
|---|---|---|---|
| CN | 102326193 | A | 1/2012 |
| CN | 106252328 | A | 12/2016 |
| | | (Continued) | |

OTHER PUBLICATIONS

Examination Report Under Section 18(3) for corresponding Great Britian Application No. 2200560.7, mailed Jan. 24, 2023.
(Continued)

*Primary Examiner* — Suberr L Chi
(74) *Attorney, Agent, or Firm* — Jason H. Vick; Sheridan Ross, PC

(57) ABSTRACT

An electronic circuit is described, comprising: a first power rail; a second power rail; and a field effect transistor, FET, the FET comprising: a first terminal coupled directly or indirectly to the first power rail; a second terminal coupled directly or indirectly to the second power rail; a channel of semiconductive material connecting the first terminal to the second terminal; a gate terminal to which a voltage may be applied to control a conductivity of the channel, the channel providing a conduction path from the first terminal to the second terminal; and a gate dielectric arranged to insulate the gate terminal from the channel. The circuit further comprises a layer or other body of dielectric material, the gate dielectric being a first portion of the layer or other body of dielectric material. The first power rail comprises a first rail portion arranged on a first side of a second portion of the
(Continued)

layer or other body of dielectric material, and the second power rail comprises a second rail portion arranged on a second side of the second portion of the layer or other body of dielectric material, the second side being opposite the first side. The second portion of the layer or other body of dielectric material separates the first and second rail portions and with the first and second rail portions provides a capacitance to the circuit.

25 Claims, 11 Drawing Sheets

(51) Int. Cl.
*H01L 29/786* (2006.01)
*H01Q 1/22* (2006.01)
*H05K 3/36* (2006.01)
*H05K 3/46* (2006.01)

(52) U.S. Cl.
CPC .............. *H01L 29/786* (2013.01); *H05K 3/36* (2013.01); *H05K 3/46* (2013.01)

(56) References Cited

U.S. PATENT DOCUMENTS

| | | |
|---|---|---|
| 6,305,002 B1 | 10/2001 | Uchida |
| 6,465,868 B1 | 10/2002 | Ehben et al. |
| 2001/0052889 A1 | 12/2001 | Fukunishi |
| 2004/0092124 A1 | 5/2004 | Suzuki et al. |
| 2005/0134435 A1 | 6/2005 | Koyama et al. |
| 2005/0162893 A1 | 7/2005 | Yagi et al. |
| 2006/0071241 A1 | 4/2006 | Jin |
| 2007/0281430 A1 | 12/2007 | Hirabayashi et al. |
| 2010/0140613 A1 | 6/2010 | Kimura |
| 2011/0012183 A1 | 1/2011 | Shionoiri |
| 2011/0012880 A1 | 1/2011 | Tanaka et al. |
| 2011/0272782 A1 | 11/2011 | Yang |
| 2012/0001189 A1 | 1/2012 | Matsubara et al. |
| 2012/0056538 A1 | 3/2012 | Shirouzu et al. |
| 2013/0181337 A1 | 7/2013 | Herder et al. |
| 2013/0228896 A1 | 9/2013 | Wada et al. |
| 2016/0358856 A1 | 12/2016 | Kim |
| 2017/0194405 A1 | 7/2017 | Tang |

FOREIGN PATENT DOCUMENTS

| | | |
|---|---|---|
| EP | 0394878 A2 | 10/1990 |
| EP | 3016089 A1 | 5/2016 |
| EP | 3260911 A1 | 12/2017 |
| JP | 09-293843 A | 11/1997 |
| JP | 2007-134482 A | 5/2007 |
| JP | 2011-077106 A | 4/2011 |
| JP | 2013-074191 A1 | 4/2013 |

OTHER PUBLICATIONS

Combined Search and Examination Report Under Sections 17 and 18(3) for corresponding Great Britain Application No. 2218594.6 mailed Jan. 26, 2023.
International Preliminary Report on Patentability for International Application No. PCT/GB2019/052524, mailed Mar. 25, 2021.
Wang, Binghao et al. "High-k Gate Dielectrics for Emerging Flexible and Stretchable Electronics" Available at https://pubs.acs.org/doi/10.1021/acs.chemrev.8b00045; Chemical Reviews, 2018, 118, 5690-5754.
International Search Report for International Application No. PCT/GB2019/052524, mailed Dec. 13, 2019.
Written Opinion for International Application No. PCT/GB2019/052524, mailed Dec. 13, 2019.
Search Report for Great Britain Application No. 1814677.9, mailed Mar. 12, 2019.
Combined Search and Examination Report Under Sections 17 and 18(3) for corresponding Great Briain Application No. 2200560.7, mailed Jun. 20, 2022.
Notification of First Office Action for Chinese Patent Application No. 201980073820.4, mailed Jan. 29, 2024.

ELECTRONIC CIRCUIT TO GENERATE A DC VOLTAGE FROM A WIRELESS SIGNAL AND METHOD OF MANUFACTURE

CROSS REFERENCE TO RELATED APPLICATIONS

This application is a national stage application under 35 U.S.C. 371 of PCT Application No. PCT/GB2019/052524, having an international filing date of 10 Sep. 2019, which designated the United States, which PCT application claimed the benefit of Great Britain Application No. 1814677.9, filed 10 Sep. 2018, each of which are incorporated herein by reference in their entirety.

FIELD

This invention relates to electronic circuits comprising first and second power rails and at least one field effect transistor. Certain embodiments relate to such circuits arranged to generate a DC voltage across the first and second power rails from a received wireless signal.

BACKGROUND

In many electronic circuits, for example RFID integrated circuits receiving their power and data from an RF signal, perhaps via an antenna, there are challenges in providing a stable, low noise power supply to the circuits. This may be achieved using a large onboard capacitor between the power rails, for example across Vdd and ground. However, such large capacitors may consume a significant area of the integrated circuit, putting a limit on its ultimate miniaturisation. Alternatively, a large capacitor between the power rails may be provided as a discrete (off-chip) component, but this approach adds complexity, scale and cost to circuit assembly.

It is known from U.S. Pat. No. 5,202,751 to provide capacitance to a conventional silicon-based semiconductor integrated circuit by arranging conductors of the two power rails in two layers mutually laminated in parallel, with a dielectric substance interposed between the two layers. However, such an arrangement complicates the circuit and its method of manufacture.

It is an object of certain aspects and embodiments of the present invention to solve, at least partly, one or more of the problems associated with the prior art.

BRIEF SUMMARY OF THE DISCLOSURE

A first aspect of the present invention provides an electronic circuit as defined by claim 1.

Advantageously, the layer or other body of dielectric material has dual purpose, in that a first portion of it provides the gate dielectric for the FET, and a second portion of it forms, together with the first rail portion and second rail portion, a capacitance. Thus, in addition to, or as an alternative to, capacitance provided by a separate capacitor incorporated in the electronic circuit, capacitance may be provided (for example for power supply smoothing purposes) by portions of the first and second power rails arranged to overlap one another, to a desired degree (in other words providing a desired overlap area), separated by the same dielectric material that is already present in the circuit to provide the FET gate dielectric. This gate dielectric material may be high k material, and/or the layer of dielectric material may be thin, and hence the capacitance provided to the circuit by the overlapping portions of the power rails, with the high-k and/or thin dielectric material between them, may be substantial.

Advantageously, manufacture of electronic circuits embodying the invention may be simpler than methods used to construct prior art circuits, because the gate dielectric and dielectric for the "power rail capacitance" (formed from overlapping portions of the first and second power rails) may be formed at the same time, i.e. in a processing single step (e.g. by deposition, or other suitable technique). Furthermore, the first and second FET terminals and the first rail portion may be formed at the same time as each other (i.e. in a single processing step), and the gate terminal and second rail portion may be formed at the same time as each other, in another single processing step.

In certain embodiments, said layer or other body of dielectric material (4) is a layer.

In certain embodiments, said layer has a thickness in the range 1 nm to 500 nm, for example 5 nm to 50 nm. There are advantages in having the layer as thin as possible, subject to any other constraints, to result in greater capacitance being provided.

In certain embodiments, said dielectric material has a dielectric constant greater than 3.9, for example greater than 4, 5, 6, or 77, 12, or 19. For example, the dielectric material may be Al2O3 with K~8, Y2O3 with K~13 (and can be used for polysilicon TFTs), tantalum oxide Ta2O5 with K~20 (and can be used for organic TFTs), or one of many other high-K materials, as identified, for example, at https://pubs.acs.org/doi/10.1021/acs.chemrev.8b00045.

In certain embodiments, said FET is a thin film transistor.

In certain embodiments, said first and second terminals (31, 32) and said first rail portion (11) are each substantially flat and coplanar with one another.

In certain embodiments, said first terminal (31) is directly connected to said first rail portion.

In certain embodiments, said first terminal (31) and said first rail portion (11) are respective portions of a flat layer or other body of conductive material.

In certain embodiments, said gate terminal (34) and said second rail portion (22) are each substantially flat and coplanar with one another.

In certain embodiments, said first rail portion (11) is in direct contact with said first side (421).

In certain embodiments, said second rail portion (22) is in direct contact with said second side (422).

In certain embodiments, the circuit further comprises an antenna (101) arranged to receive a wireless signal, rectifying means (102) connected to the antenna and to the first and second power rails and arranged to generate a DC voltage between (across) said first and second power rails from a received wireless signal.

In certain embodiments, the circuit further comprises a capacitor (103) connected between said first and second power rails to smooth said DC voltage.

In certain embodiments, the circuit further comprises a layer of semiconductive material (5), said first and second terminals (31, 32) and said first rail portion (11) are formed on a first surface of the layer of semiconductive material, said channel (33) being provided by a portion of the layer of semiconductive material (5), said layer or other body of dielectric material (4) is formed over the first and second terminals and said first rail portion, and said gate terminal (34) and second rail portion (22) are formed on a first surface of the layer or other body of dielectric material.

In certain embodiments, the circuit further comprises a substrate (6) under the layer of semiconductive material (5).

In certain embodiments, the circuit further comprises a substrate (6) and a layer of semiconductive material (5), wherein said first and second terminals (31, 32) and said first rail portion (11) are formed on a first surface of the substrate, said layer of semiconductive material (5) is formed over the first and second terminals and said first rail portion, said layer or other body of dielectric material (4) is formed over the layer of semiconductive material, and said gate terminal (34) and second rail portion (22) are formed on a first surface of the layer or other body of dielectric material (4).

In certain embodiments, the circuit further comprises a substrate (6) and a layer of semiconductive material (5), wherein said first and second terminals (31, 32) and said first rail portion (11) are formed on a first surface of the substrate, said layer of semiconductive material (5) is formed at least between the first and second terminals to provide said channel (33), said layer or other body of dielectric material (4) is formed over the layer of semiconductive material and the first and second terminals and the first rail portion, and said gate terminal (34) and second rail portion (22) are formed on a first surface of the layer or other body of dielectric material (4).

In certain embodiments, the circuit further comprises a substrate (6) and a layer of semiconductive material (5), wherein said gate terminal (34) and said second rail portion (22) are formed on a first surface of the substrate, said layer or other body of dielectric material (4) of is formed over the gate terminal and said second rail portion, said first and second terminals (31, 32) and said first rail portion (11) are formed over the layer or other body of dielectric material, and said layer of semiconductive material (5) is formed at least between the first and second terminals to provide said channel.

In certain embodiments, the circuit further comprises a substrate (6) and a layer of semiconductive material (5), wherein said gate terminal (34) and said second rail portion (22) are formed on a first surface of the substrate, said layer or other body of dielectric material (4) is formed over the gate terminal and said second rail portion, said layer of semiconductive material (5) is formed over at least a portion of the layer or body of dielectric material (4) covering the gate terminal, and said first and second terminals (31, 32) and said first rail portion (11) are formed over the layer of semiconductive material and the layer or other body of dielectric material.

Another aspect of the invention provides an electronic circuit comprising: a first power rail (1); a second power rail (2); and a layer or other body of dielectric material (4), wherein the first power rail comprises a first rail portion (11) arranged on a first side of the layer or other body of dielectric material (4), and the second power rail comprises a second rail portion (22) arranged on a second side of the layer or other body of dielectric material, said second side being opposite said first side, said first rail portion comprising a first grid or mesh of crossing and intersecting conductive elements (11a-11i) and said second rail portion comprising a second grid or mesh of crossing and intersecting conductive elements (22a-22i), said first and second grids or meshes having the same shape (or, in other words, footprint, i.e. projection onto a plane) and being aligned with one another, on said opposite first and second sides, so as to form, together with a portion (42) of the layer or other body of dielectric material sandwiched between them, a capacitor.

In certain embodiments, the circuit further comprises a field effect transistor (3) comprising: a first terminal (31) coupled directly or indirectly to the first power rail; a second terminal (32) coupled directly or indirectly to the second power rail; a channel of semiconductive material (33) connecting the first terminal to the second terminal; a gate terminal (34) to which a voltage may be applied to control a conductivity of said channel, said channel providing a conduction path from the first terminal to the second terminal; and a gate dielectric (35) arranged to insulate the gate terminal from said channel, wherein said gate dielectric comprises a portion (41) of said layer or other body of dielectric material (4).

In certain embodiments, the electronic circuit comprises a further capacitor (103) connected between said power rails, said further capacitor comprising a first capacitor plate (1031), connected to the first power rail (1), and arranged on said first side, a second capacitor plate (1032), connected to the second power rail, and arranged on said second side, and a further portion (400) of said layer or other body of dielectric material, said further portion being a portion located between said first and second capacitor plates.

In certain embodiments, the circuit further comprises an antenna (101) arranged to receive a wireless signal, rectifying means (102) connected to the antenna and to the first and second power rails (1,2) and arranged to generate a DC voltage between (across) said first and second power rails from a received wireless signal.

Another aspect of the invention provides a method of manufacturing an electronic circuit comprising a first power rail (1), a second power rail (2), and a field effect transistor (3), FET, comprising a first terminal (31) coupled directly or indirectly to the first power rail, a second terminal (32) coupled directly or indirectly to the second power rail, a channel (33) of semiconductive material connecting the first terminal to the second terminal, a gate terminal (34) to which a voltage may be applied to control a conductivity of said channel, said channel providing a conduction path from the first terminal to the second terminal; and a gate dielectric (35) arranged to insulate the gate terminal from said channel, the method comprising: forming a layer or other body of dielectric material comprising a first portion and a second portion; forming the first and second terminals and a first rail portion of the first power rail at the same time on a first side of the layer or other body of dielectric material; forming the gate terminal and a second rail portion of the second power rail at the same time on a second side of the layer or other body of dielectric material, wherein said first and second rail portions are positioned on opposite sides of said second portion so as to form, together with said second portion, a capacitor, and wherein said gate terminal and first and second terminals are positioned such that said first portion provides said gate dielectric.

In certain embodiments, said forming of the first and second terminals and first rail portion is performed before forming said layer or other body of dielectric material, and said forming of the gate terminal and second rail portion is performed after forming said layer or other body of dielectric material.

In certain embodiments, said forming of the first and second terminals and first rail portion is performed after forming said layer or other body of dielectric material, and said forming of the gate terminal and second rail portion is performed before forming said layer or other body of dielectric material.

It will be appreciated that, although the concept of arranging power and earth conductors in two parallel layers, with a dielectric in between to provide a capacitance, is known for a conventional silicon based IC from U.S. Pat. No.

5,202,751, embodiments of aspects of the present invention are significantly different, and provide numerous advantages.

For example, the distributed capacitance of the first and second rail portions when provided in grid or mesh form in certain embodiments, provide a significant part of the overall power rail capacitance for the integrated circuit, not just a small local charge reservoir.

Silicon integrated circuits do not have flat, planar metal layers, with high capacitance dielectrics between them, and certainly not among the device layers. Whilst such layers may be provided among the back end interconnect layers stacked above the device layers, these typically use low-k dielectrics to minimise coupling between layers, and are thicker, further reducing coupling between layers. Thus, conventional silicon processing cannot effectively incorporate the novel structures described in this patent specification into layers already existing in their processes.

BRIEF DESCRIPTION OF THE DRAWINGS

Embodiments of the invention will now be described with reference to the accompanying figures, of which.

DETAILED DESCRIPTION OF EMBODIMENTS

Figure 1:
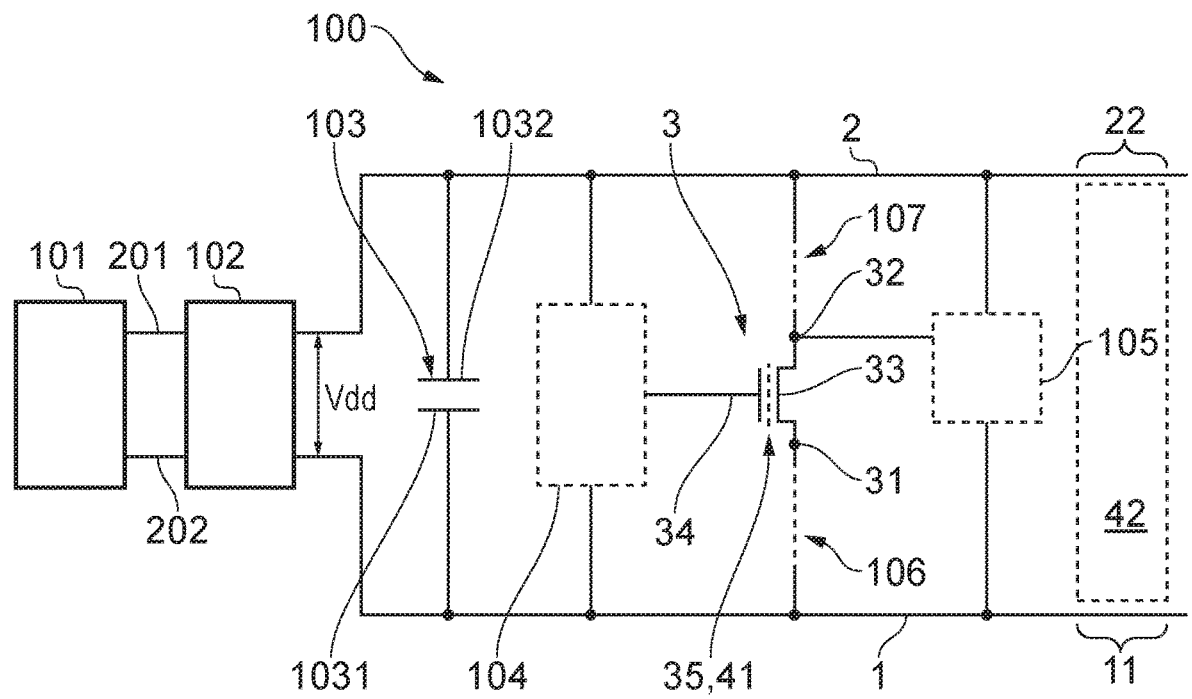
FIG. 1 is a schematic representation of an electronic circuit embodying the invention.

Referring now to FIG. 1, this shows an electronic circuit embodying the invention. The circuit 100 comprises an antenna 101 (or antenna means), arranged to receive a wireless signal and provide a corresponding alternating voltage, generated by the received signal, via antenna terminals 201, 202 to a rectifier or rectifying means 102. The rectifier 102 generates a DC supply voltage Vdd between two power rails, namely a first power rail 1 and a second power rail 2. The circuit further comprises a capacitor 103 arranged to provide some smoothing of the DC power supply voltage Vdd. The circuit further comprises an FET 3 having: a first terminal 31 coupled by coupling means 106 to the first power rail; a second terminal 32 coupled by coupling means 107 to the second power rail; a channel 33 of semiconductive material connecting the first terminal to the second terminal; a gate terminal 34 to which a voltage may be applied to control a conductivity of the channel 33; and a gate dielectric 35 arranged to insulate the gate terminal from the channel. In this example, the control voltage supplied to the gate terminal of the FET 3 is supplied from a further portion 104 of the electronic circuit, whose details are not necessary for understanding the invention. Accordingly, that further portion 104 of the circuit is simply indicated by a broken line in the figure. Similarly, the voltage at the second terminal 32 of the FET 3 is provided to a further portion 105 of the circuit, whose details are not necessary for an understanding of the invention. In certain embodiments, the first terminal 31 is coupled directly to the first power rail 1, i.e. it is connected to the first power rail by conducting means (e.g. one or more conductive tracks) having insignificant resistance, and there is no circuit component between terminal 31 and the first power rail 1. However, in alternative embodiments, the first terminal 31 may be indirectly coupled to the first power rail 1, for example by one or more circuit components, such as one or more resistors, or one or more other passive circuit components, or one or more active components. Similarly, in various embodiments of the invention, the second terminal 32 may be coupled directly or indirectly to the second power rail 2.

In this first example, the circuit comprises a layer or other body of dielectric material, the gate dielectric 35 being provided by a first portion 41 of that layer or other body of dielectric material. Additionally, the first power rail 1 comprises a first rail portion 11 arranged on a first side of a second portion 42 of the layer or other body of dielectric material, and the second power rail 2 comprises a second rail portion 22 arranged on a second side of the second portion 42 of the layer or other body of dielectric material, that second side being opposite the first side. Thus, the second portion 42 of the layer or other body of dielectric material separates the first 11 and second 22 rail portions, and with the first and second rail portions provides a capacitance to the circuit in addition to that provided by capacitor 103.

It will be appreciated that FIG. 1 is highly schematic, and in practical embodiments of the invention the overlapping portions 11 and 22 of the first and second power rails may be separated by a small distance, that distance being the thickness of the second portion 42 of the layer or other body of dielectric material, which in certain embodiments is itself a thin layer of high-k material.

Figure 2:
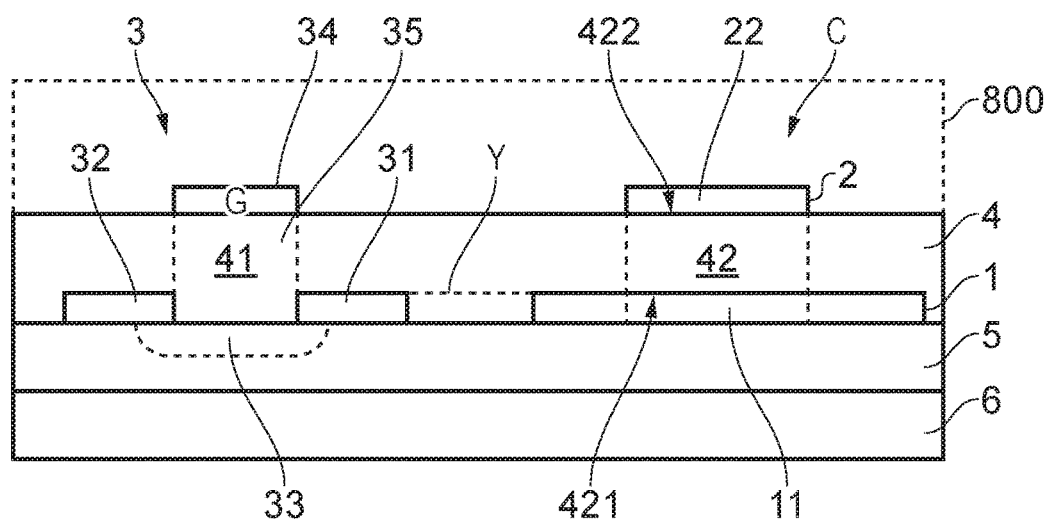
FIG. 2 is a schematic cross section of part of another electronic circuit embodying the invention.

Referring now to FIG. 2, this illustrates a cross section of part of an electronic circuit embodying the invention. The circuit comprises a layer 5 of semiconductor material formed on a suitable substrate 6, which may, in certain embodiments be flexible. On top of the semiconductor layer 5 (i.e. on a first surface of the semiconductor layer) are formed the first and second terminals 31, 32 of the FET 3 and at least a portion of the first power rail 1. In this figure, neither the first terminal 31 nor second terminal 32 are directly connected to the power rail 1, but in alternative embodiments one of those terminals, for example the first terminal 31 may be directly connected to the first power rail 1. This direct connection or direct coupling may be achieved, for example, by forming the first terminal 31 and first power rail 1 as integral portions of a single body, layer, region, or area of conductive material. Such optional direct connection is indicated by the broken line Y in the figure. A layer 4 of high k dielectric material has been formed over the first and second terminals and the first power rail 1, such that the first and second terminals and first power rail 1 are arranged on an underside of the dielectric layer 4. On an upper surface or side of the dielectric layer 4 there are formed a gate terminal 34 and at least a portion of the second power rail 2. The gate terminal 34 is arranged generally over the gap between the first and second terminals 31, 32 so that a voltage applied to the gate terminal 34 may be used to control a conductivity of a semiconductive channel 33 in the semiconductive layer 5, providing an electric conduction path between the first terminal 31 and a second terminal 32. It will be appreciated that a first rail portion 11 of the first power rail 1 is overlapped by a second rail portion 22 of the second power rail, with, in this example, just a second portion 42 of the layer of dielectric material separating them. Thus, the first and second rail portions 11, 12, together with the second portion 42 of dielectric material form a capacitor, indicated by the arrow labelled C in the figure. A first portion 41 of that same layer of dielectric material 4 provides the gate dielectric 35 of the FET 3. It will be appreciated that in certain embodiments the structure may further include one or more additional device layers, indicated generally by reference number 800.

Thus, in the embodiment of FIG. 2, the first rail portion 11 is arranged on a first side 421 of the second portion 42 of the layer of dielectric material 4, and the second rail portion 22 is arranged on a second side 422 of the second portion 42 of the layer of dielectric material 4. In other words, the first and second power rails 1, 2 are arranged to have portions 11 and 22 which are aligned with one another, on opposite sides of the dielectric layer 4 which also provides the gate dielectric. The areas of these overlapping portions 11, 22 may be selected (i.e. designed), together with the thickness of the dielectric layer 4 and dielectric constant k of the dielectric material 4, so as to provide a desired capacitance C to the circuit.

Figure 3:
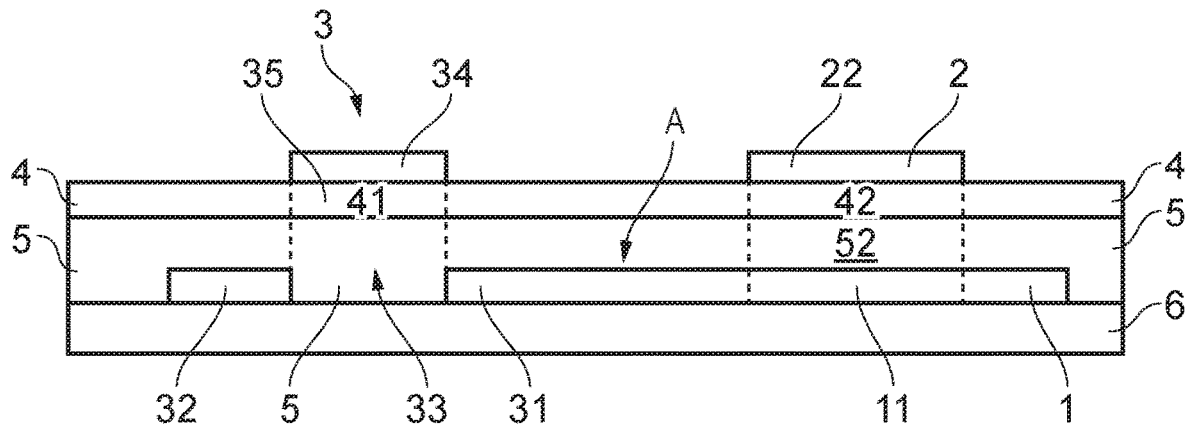
FIGS. 3-5 are schematic cross sections of alternative electronic circuits embodying the invention; each having a top gate structure.

Referring now to FIG. 3, this illustrates an alternative electronic circuit also having a top gate structure. Here, rather than the semiconductor layer 5 being provided beneath the first and second terminals, it is formed over the first and second terminals and first rail portion 11. The gate dielectric layer 4 is then formed over the semiconductor layer 5, and the gate terminal 34 and second rail portion 22 are provided on top of the gate dielectric layer 4. Again, a first portion 41 of the gate dielectric layer provides the gate dielectric 35 to the FET 3, and a second portion 42 provides part of the capacitive material between the aligned, overlapping first and second portions 11, 22. Those first and second rail portions 11, 22 are additionally separated by a portion 52 of the layer of semiconductive material 5. It will be appreciated that this arrangement results in the "power rail capacitor" having a lower capacitance than if the portion 52 of semiconductor material were not present between the rail portions 11 and 22, but depending on device requirements, this may be tolerable or desirable.

Figure 4:
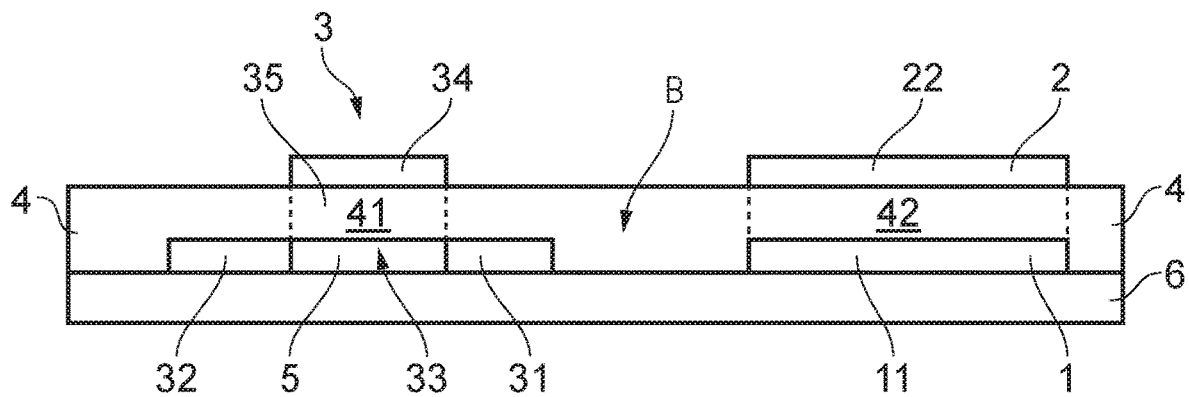

Referring now to FIG. 4, in an alternative electronic circuit incorporating a top gate FET 3, rather than providing an extensive layer of semiconductor material, semiconductor material is provided just between the first and second terminals 31 and 32 to provide the channel portion 33. In this example, the second terminal and first terminal 32, 31 are not directly connected to the first rail portion 11, as indicated by arrow B (in contrast to the direct connection between the first terminal 31 and first rail portion 11 as indicated by arrow A in FIG. 3). The dielectric layer 4 is formed over the first and second terminals and first rail portion 11 and semiconductive channel 33, so that in this example the first and second rail portions 11 and 22 are separated only by dielectric material 4, in particular the second portion 42 of dielectric layer 4.

Figure 5:
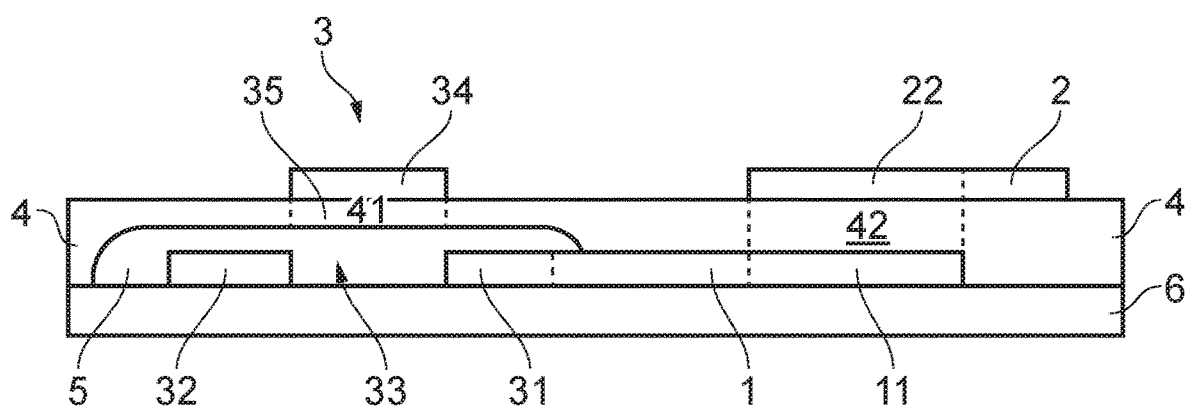
Figure 6:
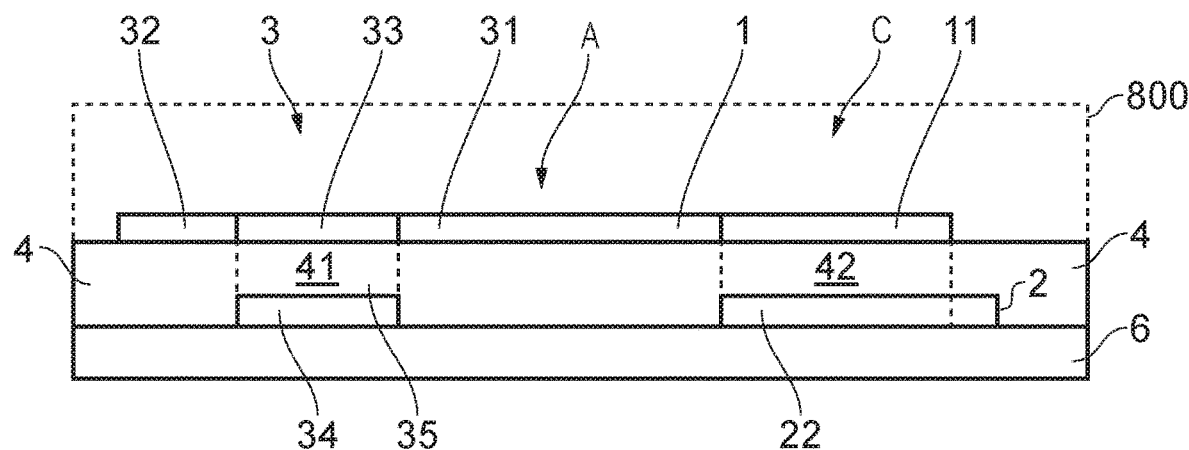
FIGS. 6-9 are schematic cross sections of parts of further electronic circuits embodying the invention; each having a bottom gate structure.

In the example shown in FIG. 5, a layer of semiconductor material 5 has been formed over the first and second FET terminals, 31, 32 and over part of the first power rail 1. However, the layer of semiconductor material 5 does not extend between the first and second rail portions 11 and 22, which are separated only by the thickness of the second portion 42 of dielectric layer 4.

Referring now to FIGS. 6-9, these show a series of alternative embodiments which can generally be described as incorporating bottom gate structures. Thus, in FIG. 6 the gate terminal 34 and second rail portion 22 are formed on a surface of a substrate 6, and the layer of dielectric material 4 has been formed on top of the gate and second rail portion 22. The first and second terminals 31, 32 and first rail portion 11 are formed on top of the layer of dielectric material 4, in this example with the first terminal 31 being directly connected (see arrow A) to the first rail portion 11. In this example the FET channel 33 is provided by semiconductive material arranged just between the first and second terminals 31 and 32, again on top of the layer of dielectric material 4.

Figure 7:
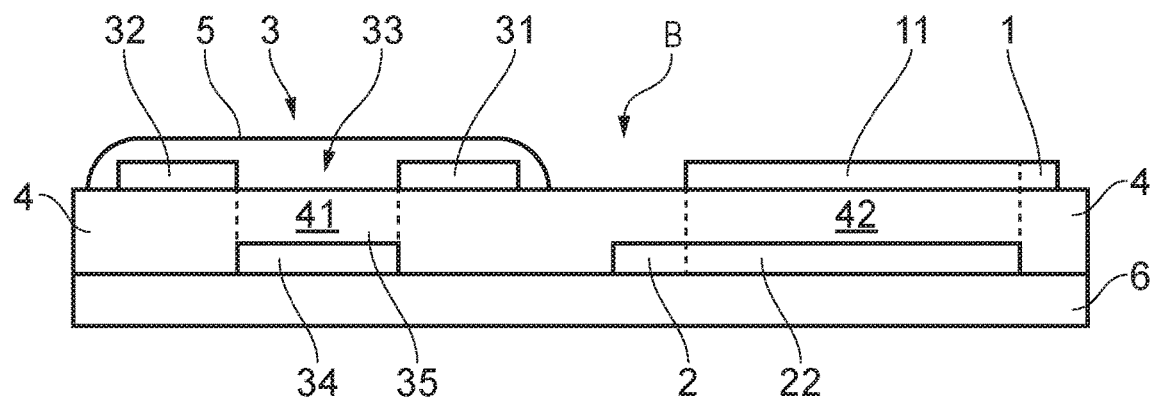

In the example shown in FIG. 7, the semiconductive material is formed as a more extensive layer or body 5, covering the first and second terminals 31, 32, neither of which is directly connected to the first rail portion 11.

Figure 8:
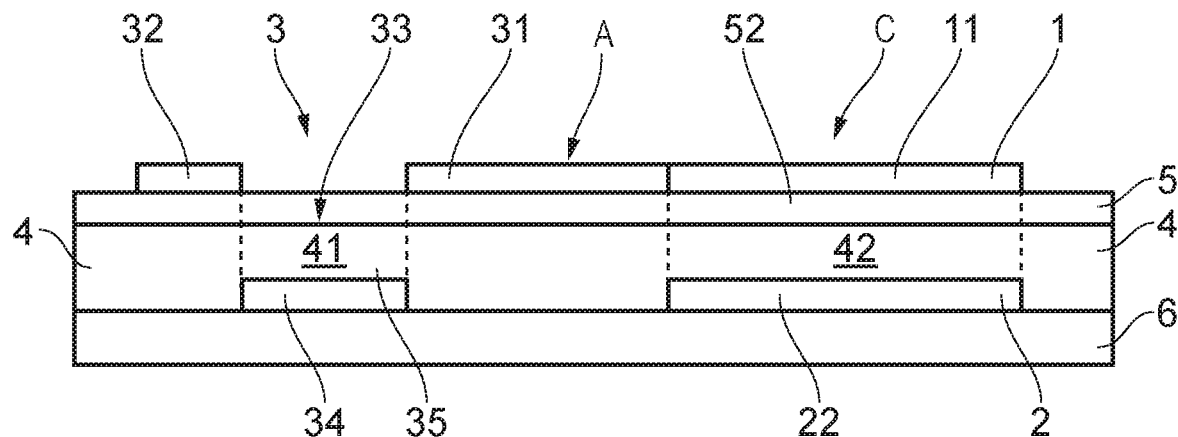

FIG. 8 shows an alternative structure, in which the semiconductive channel 33 is provided by a portion of a layer 5 of semiconductor material formed on top of the dielectric layer 4, and the first and second terminals 31, 32 and first rail portion 11 are formed on top of (i.e. on an upper surface of) the semiconductor layer 5. In this example, the capacitance C provided by the overlapping portions 11 and 22 of the power rails is determined by the areas of those portions 11, 22, the thicknesses of the portions 42 and 52 of the dielectric layer and semiconductor layer respectively, between the rail portions 11 and 22, and the dielectric constants of the semiconductor material 5 and dielectric material 4.

Figure 9:
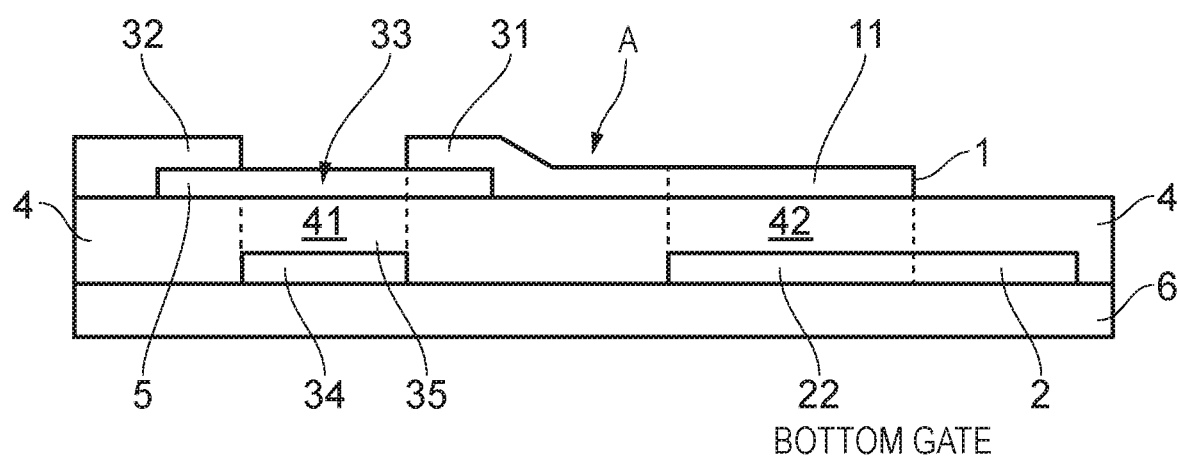

FIG. 9 illustrates an alternative bottom gate structure where a region of semiconductor material 5 is deposited on top of the gate dielectric layer 4 to provide the FET channel 33, and the first and second terminals 31 and 32 are formed so as to partially overlap the layer or body of semiconductor material 5. In this example the layer of semiconductor material 5 does not extend between the first and second rail portions 11, 22 which are separated just by the second portion 42 of the dielectric layer 4.

Figure 10:
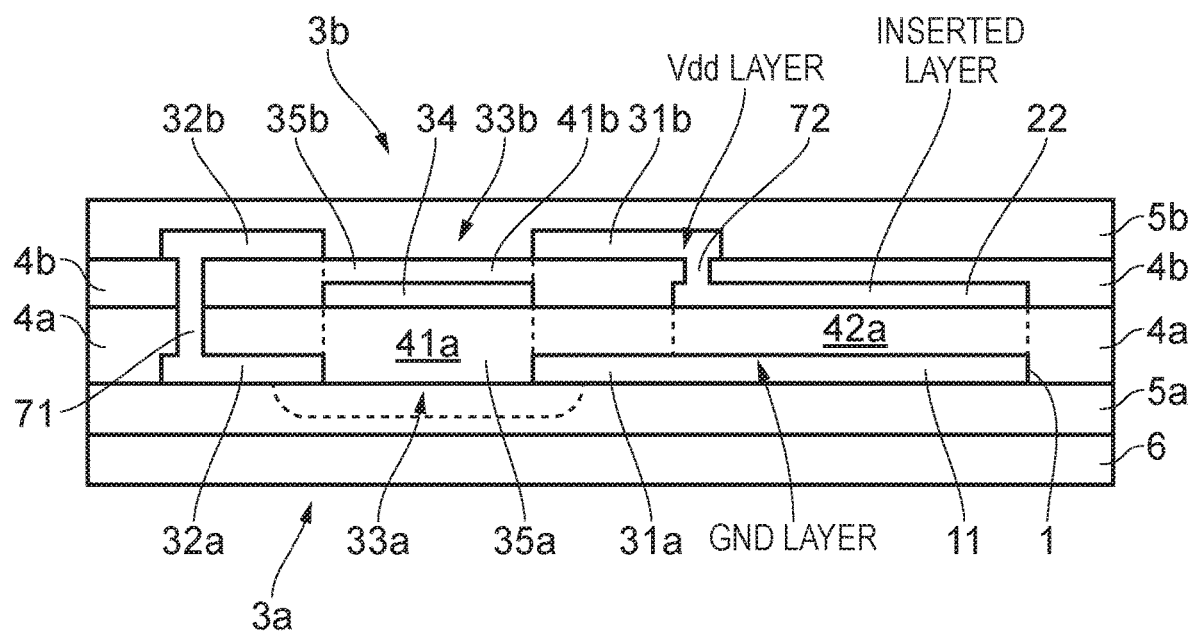
FIGS. 10 and 11 are schematic cross sections of parts of further electronic circuits embodying the invention, each comprising two FETs.

The principles of the overlapping power rail portions to provide additional capacitance can be applied even to circuits in which the device terminals connected to power planes are separated by a large vertical distance. An example of such a circuit is shown in FIG. 10. In this example, the circuit comprises stacked device layers, in which two layers in the integrated circuit contain thin film transistor (TFT) channels 33a, 33b. Stacked TFT devices 3a and 3b share a common gate terminal 34 in this example. The uppermost and lowermost device terminal layers (source-drain for the respective devices) are connected to power planes Vdd and Gnd, respectively. To increase the capacitance between the Vdd plane and the Gnd plane, a metal plane 22 is inserted between them and then connected to one or other of those planes. In this example, the inserted layer 22 is conveniently formed in the gate metal layer and is connected to the Vdd layer. The inserted layer is more closely coupled to the Gnd layer than it would be in the Vdd layer, so the capacitance between them is increased. The same principles could be applied to other stepped gate structures, for example those employing two gate terminal layers, and those having bottom gate thin film transistors.

In more detail, the example shown in FIG. 10 comprises a first FET 3a having a first terminal 31a, a second terminal 32*a*, a common gate terminal 34, a semiconductive channel 33*a* provided by a portion of a semiconductor layer 5*a* formed on a substrate 6, and a gate dielectric 35*a* provided by a first portion 41*a* of a first layer of dielectric material 4*a*. In the same plane as the first and second terminals 31*a*, 32*a* there is provided a first rail portion 11, directly connected to the first terminal 31*a* in this example. The inserted layer provides the second rail portion 22, separated from the first rail portion 11 by the second portion 42*a* of dielectric material, and the second rail portion 22 is in the same plane as the common gate terminal 34. A second layer of dielectric material 4*b* is formed over the common gate 34 and second rail portion 22, and on top of that second dielectric layer 4*b* are formed the first terminal 31*b* and second terminal 32*b* of the second FET 3*b* (which is stacked above the first). A first via 71 connects the respective second terminals 32*a* and 32*b*, passing through the dielectric layers 4*a* and 4*b*. A second via 72 connects the first terminal 31*b* of the second FET 3*b* to the second rail portion 22, extending through the second dielectric layer 4*b*. A first portion 41*b* of the second dielectric layer 4*b* provides the gate dielectric 35*b* of the second FET 3*b*. Thus, in this compact arrangement, the gate terminal 34 simultaneously controls the conductivity of the channels 33*a* and 33*b* in the two FETs, and the conductive material 22 formed in the same plane as the common gate 34 provides capacitance to the circuit, in combination with second portion 42*a* of dielectric material and first rail portion 11.

Figure 11:
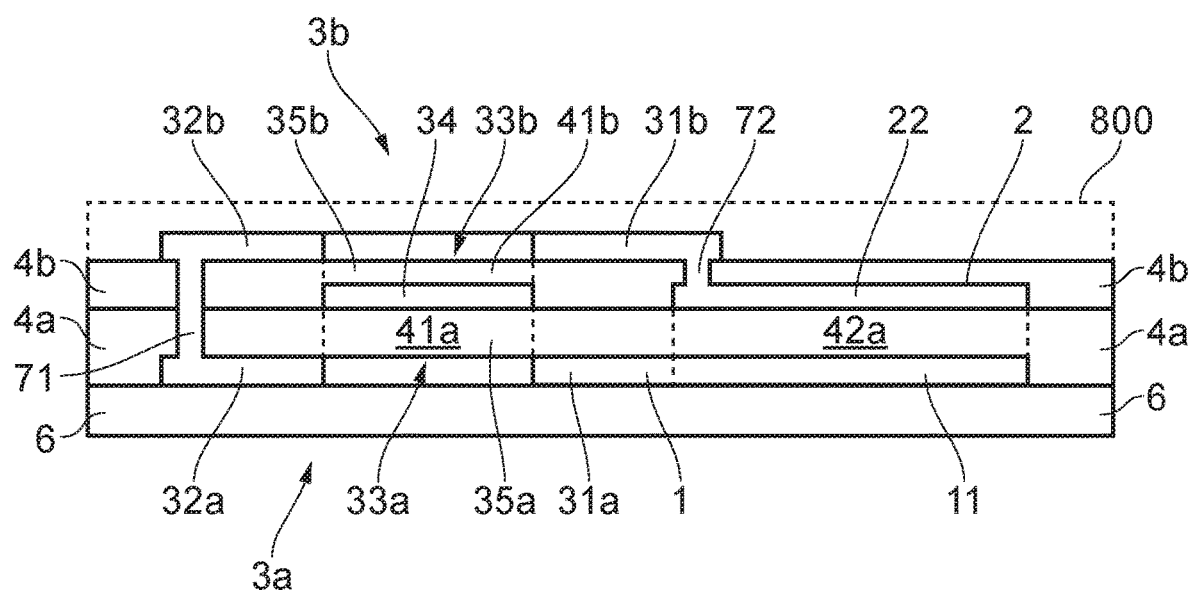

Referring now to FIG. 11, this shows part of another electric circuit embodying the invention and also comprising stacked FETs. This example is similar to that shown in FIG. 10, but here semiconductor material is provided just between the respective first and second terminals of each device 3*a*, 3*b*. This circuit may additionally comprise one or more further device layers, indicated generally by 800.

Figure 12:
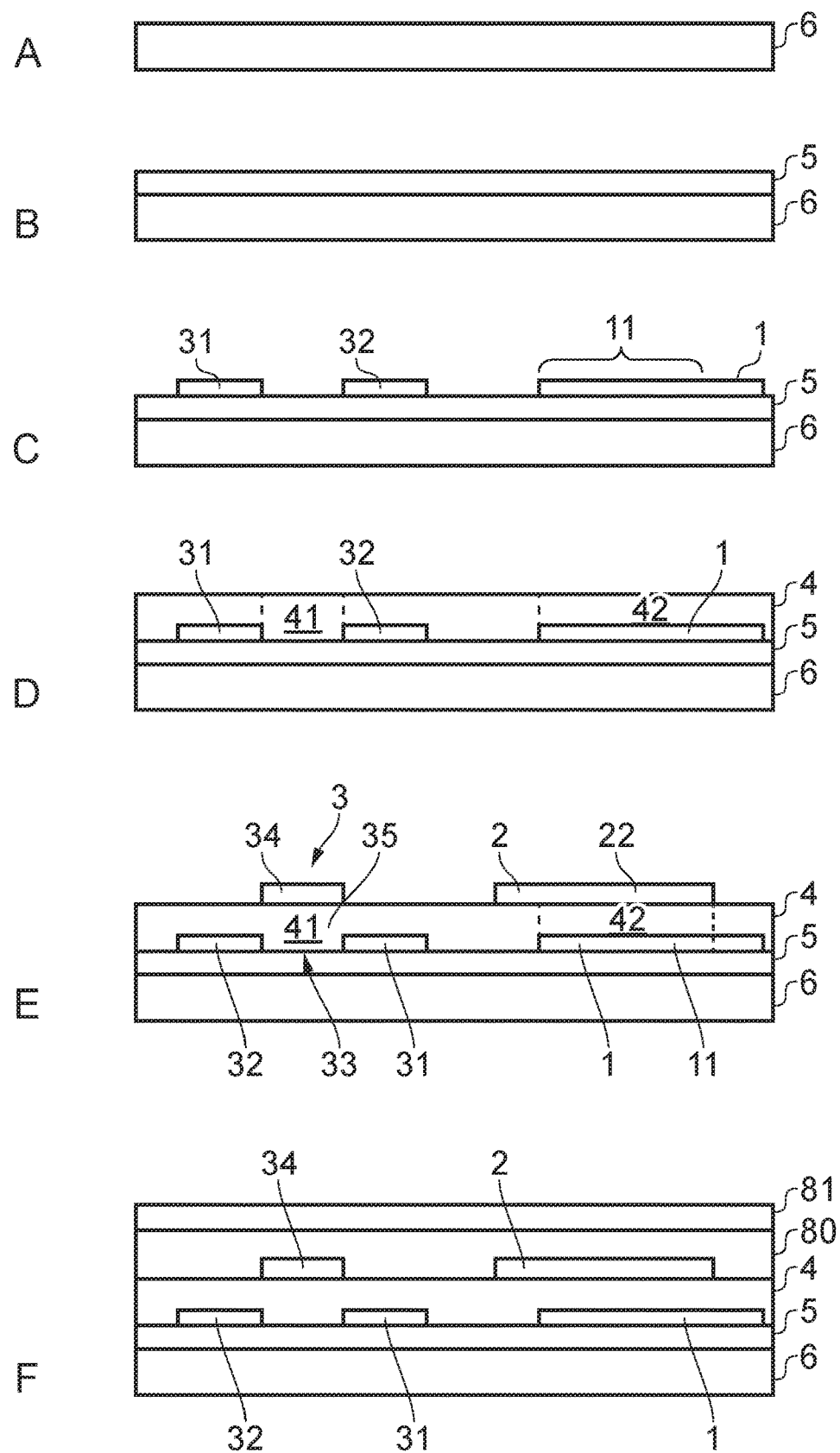
FIG. 12 is a schematic representation of a method of manufacturing an electronic circuit embodying the invention.

Referring now to FIG. 12, this illustrates a method of manufacturing an electronic circuit in accordance with an embodiment of the invention. In step A, a suitable substrate 6 is first provided. In step B a layer of semiconductor material 5 is formed on the substrate 6. It will be appreciated, however, that in alternative embodiments a layer of semiconductor material 5 may be formed at a different step in the sequence, depending on the desired FET structure. Illustrative examples of FET structures that may be manufactured in a circuit by this method are shown in FIGS. 2 to 11. In step C, the first and second FET terminals 31, 32 are formed at the same time (i.e. in a common processing step or operation) as at least a first rail portion 11 of a first power rail 1. Thus, terminals 31 and 32 and first rail portion 11 may be provided by conductive material suitably formed in a pattern on an upper surface of the semiconductor layer 5. In step D, a layer of dielectric material 4 is formed, comprising at least a first portion 41 and a second portion 42. In this example, the dielectric layer is formed over the first and second terminals and first rail portion 11, but in alternative embodiments the dielectric layer may be formed before the first and second terminals and first rail portion, for example over a bottom gate and second rail portion. In step E in this example, a gate terminal 34 and at least a second rail portion 22 of a second power rail 2 are formed at the same time (again, in a common processing step or operation) on an upper surface of the dielectric layer 4, suitably positioned so that the gate terminal 34 may be used to control a conductivity of the channel 33 in the semiconductor layer 5 between the first and second FET terminal 31, 32. However, in alternative embodiments (for example incorporating bottom gate FETS), the gate 34 and second rail portion may be formed before the dielectric layer 4, e.g. on a substrate. The second power rail is suitably positioned so that a second rail portion 22 is located over the first rail portion 11 of the first power rail 1, with a second portion 42 of the dielectric layer 4 sandwiched between them so as to provide a capacitor. A first portion 41 of the dielectric layer 4 provides the gate dielectric 35 of the FET 3. In step F, additional device layers 80 and 81 have been formed over the underlying structure. It will be appreciated that advantages provided by this method of manufacture are that:

The first and second FET terminals and the first rail portion are formed together, at the same time, in a common processing step or operation;

The gate dielectric 35 and power rail capacitance dielectric (41 and 42) are formed together, at the same time, in a common processing step or operation, and they are integral portions of a single layer 4 of dielectric material; and The gate terminal and second rail portion 22 are formed together, at the same time, in a common processing step or operation.

Thus, additional capacitance may be provided to the circuit without requiring additional processing steps, that is processing steps in addition to those required for producing just the FET.

Figure 13:
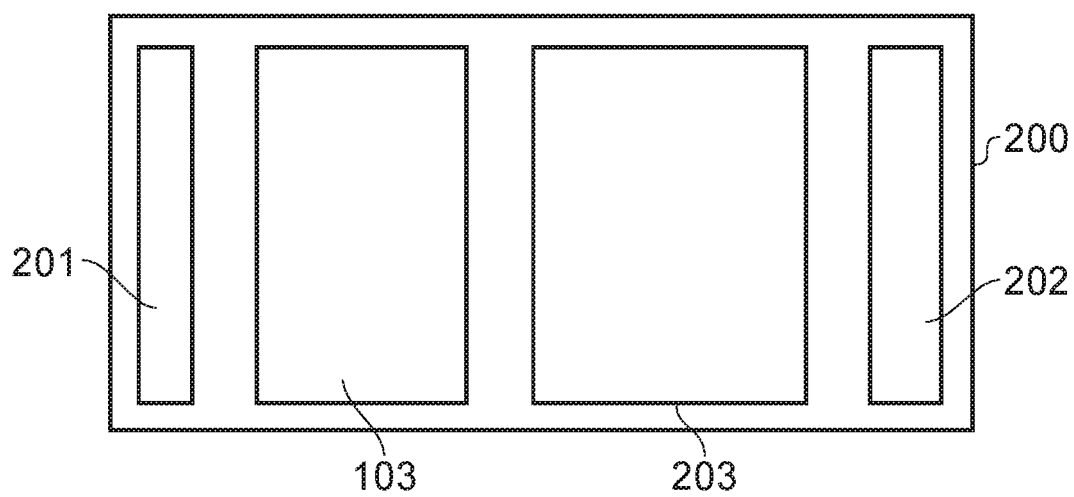
FIG. 13 is a schematic plan view of another circuit embodying the invention.

Referring now to FIG. 13, this is a highly schematic representation of part of another electronic circuit embodying the invention. The electronic circuit 200 comprises antenna contacts 201, 202, adapted to be attached to an antenna arranged to receive a wireless signal (e.g. an RF signal). A portion of the footprint or area of the circuit 200 is taken up by the plates of a capacitor 103 connected between the circuit's power rails so as to provide smoothing to the supply voltage generated from the AC voltage received via the antenna terminals 201, 202. A further portion 203 of the entire circuit area contains circuitry and circuit elements, including one or more FETs. That area 203 also includes at least portions of first and second power rails, those portions including at least a first rail portion and a second rail portion which are separated by a layer of dielectric material and provide additional capacitance to the circuit, that is capacitance in addition to that provided by capacitor 103. In certain embodiments of the invention, the area of overlap of the first and second power rails (i.e. the area of the first and second rail portions 11, 22) is selected to provide, together with separate capacitor 103, a desired total capacitance between the power rails.

Figure 14:
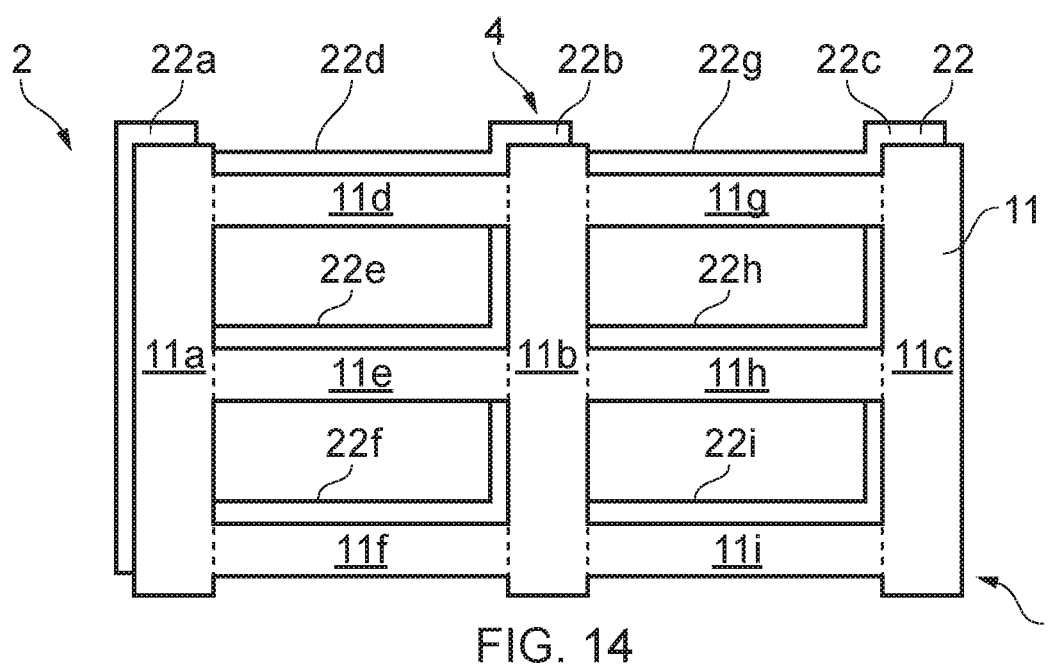
FIG. 14 and FIGS. 14b-14e are schematic representations of overlapping power meshes used in certain embodiments of the invention.

FIG. 14 illustrates (in a schematic perspective view) a power mesh structure which may be incorporated in certain embodiments of the invention. In this example, an electronic circuit comprises a first power rail 1, a second power rail 2, and a layer or other body of dielectric material 4 (the location of that layer 4 is indicated generally in FIG. 14, but the layer of dielectric material is not directly illustrated, so that the overlapping nature of the power rails 1 and 2 can be seen more clearly). The first power rail comprises a first rail portion 11 arranged on a first side of the layer or other body of dielectric material 4, and the second power rail comprises a second rail portion 22 arranged on an opposite side of the layer or other body of dielectric material 4. The first rail portion 11 comprises a first grid or mesh of crossing and/or intersecting conductive elements 11*a*-11*i*, and the second rail portion 22 comprises a second grid or mesh of crossing and/or intersecting conductive elements 22*a*-22*i*. The first and second grids or meshes have substantially the same shape (or, in other words, they have substantially the same footprint or projection onto a plane parallel to them). The first and second grids or meshes are aligned with one another so as to form, together with a portion of the layer or other body of dielectric material 4 sandwiched between them, a capacitor.

Thus, in embodiments employing power rails such as those shown in FIG. 14, the power rail capacitance is, at least in significant part, distributed in a power mesh structure that may place the Vdd and Gnd lines in different metal layers, and then routes them directly on top of each other within a circuit layout. Circuit elements, for example components, devices, and cells, in certain embodiments are placed in the areas between the overlapping conductive elements of the grids, and are connected to those conductive elements as appropriate for a given circuit design.

The coincident/overlapping grid or mesh structure shown in FIG. 14 has a significant advantage in reducing circuit footprint, since the area for Vdd and Gnd is shared, and directly reduces the amount of integrated circuit area that needs to be consumed by a dedicated capacitor. Indeed, in certain embodiments, utilising the overlapping/coincident mesh structure of FIG. 14 enables the dedicated capacitor area to be made smaller, and in further embodiments the separate or dedicated capacitor may not be required at all, if the power rail capacitance may be provided solely by the overlapping/coincident first and second rail portions 11, 22.

Figure 14B:
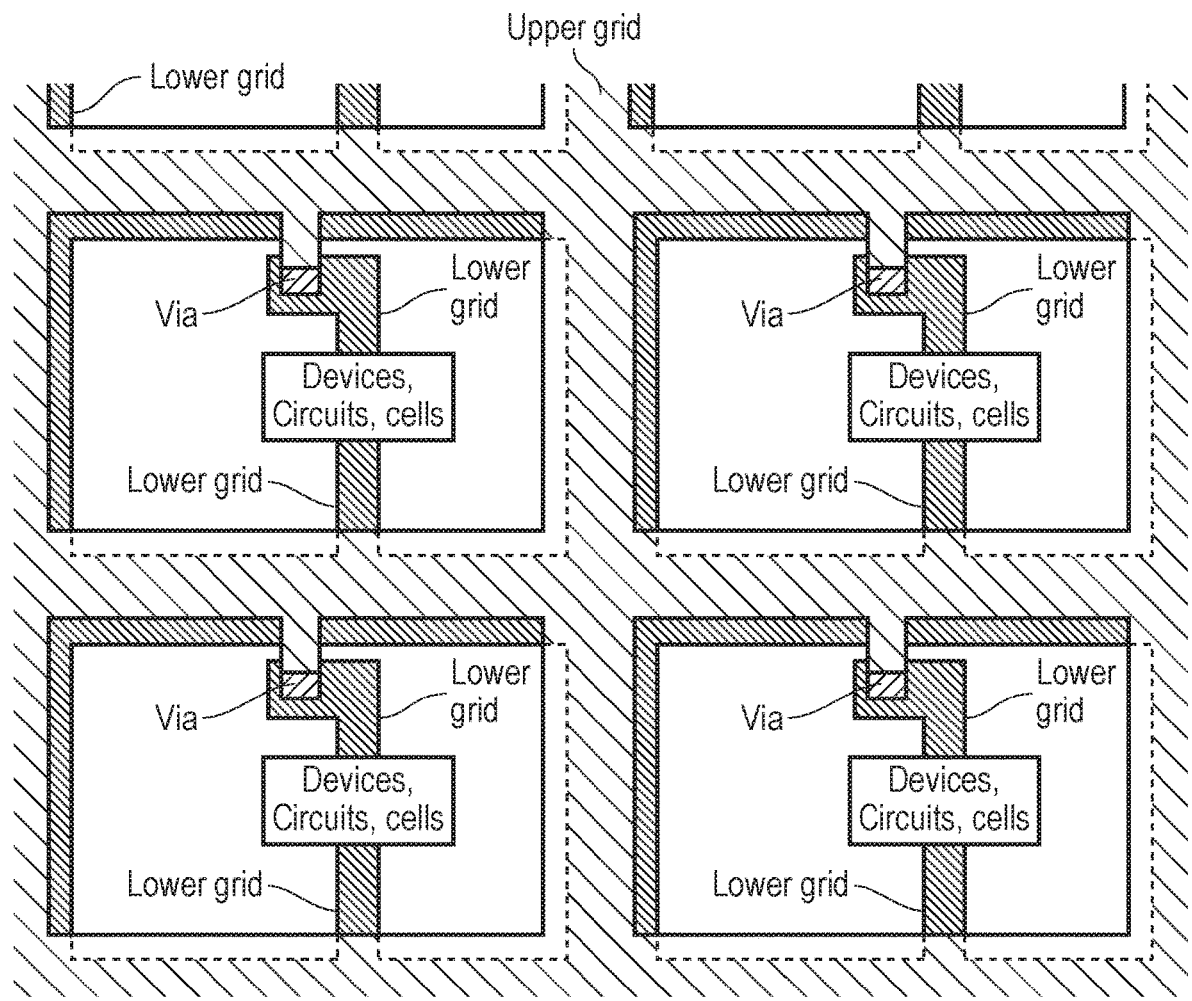
Figure 14B:
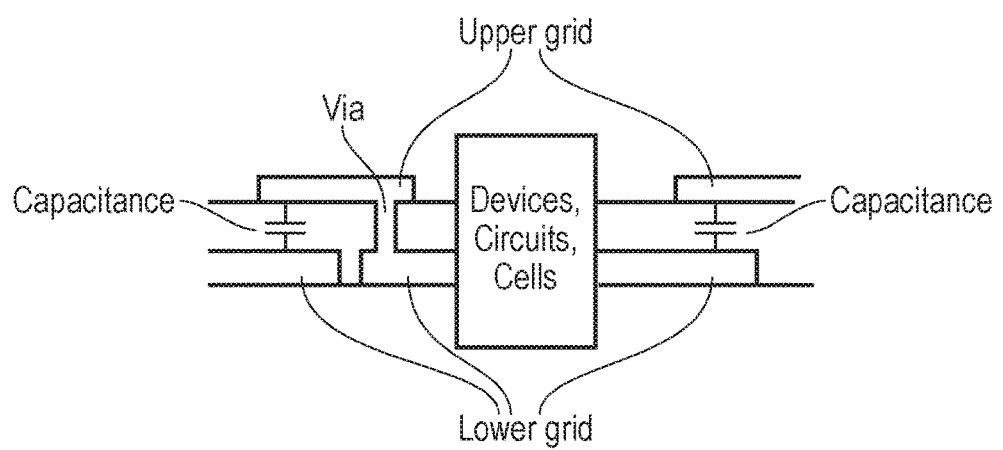
Figure 14C:
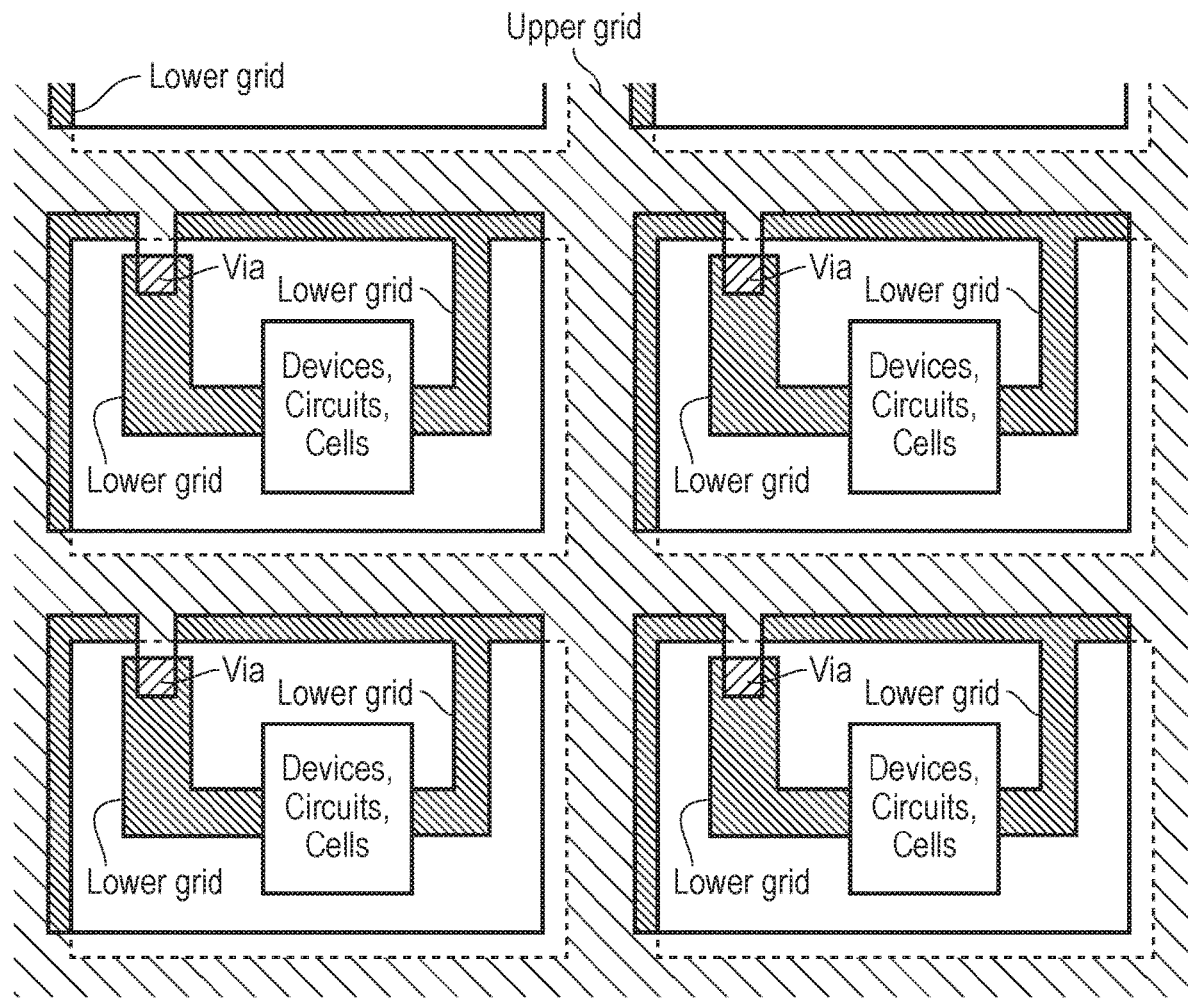
Figure 14C:
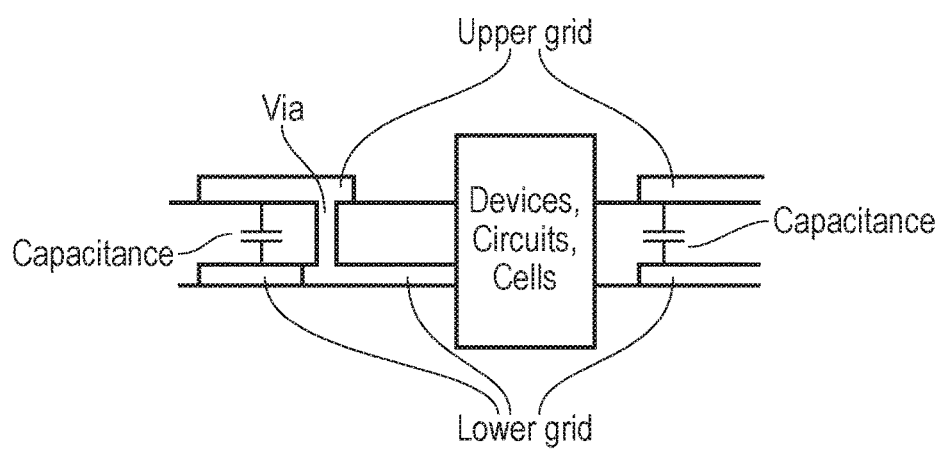
Figure 14D:
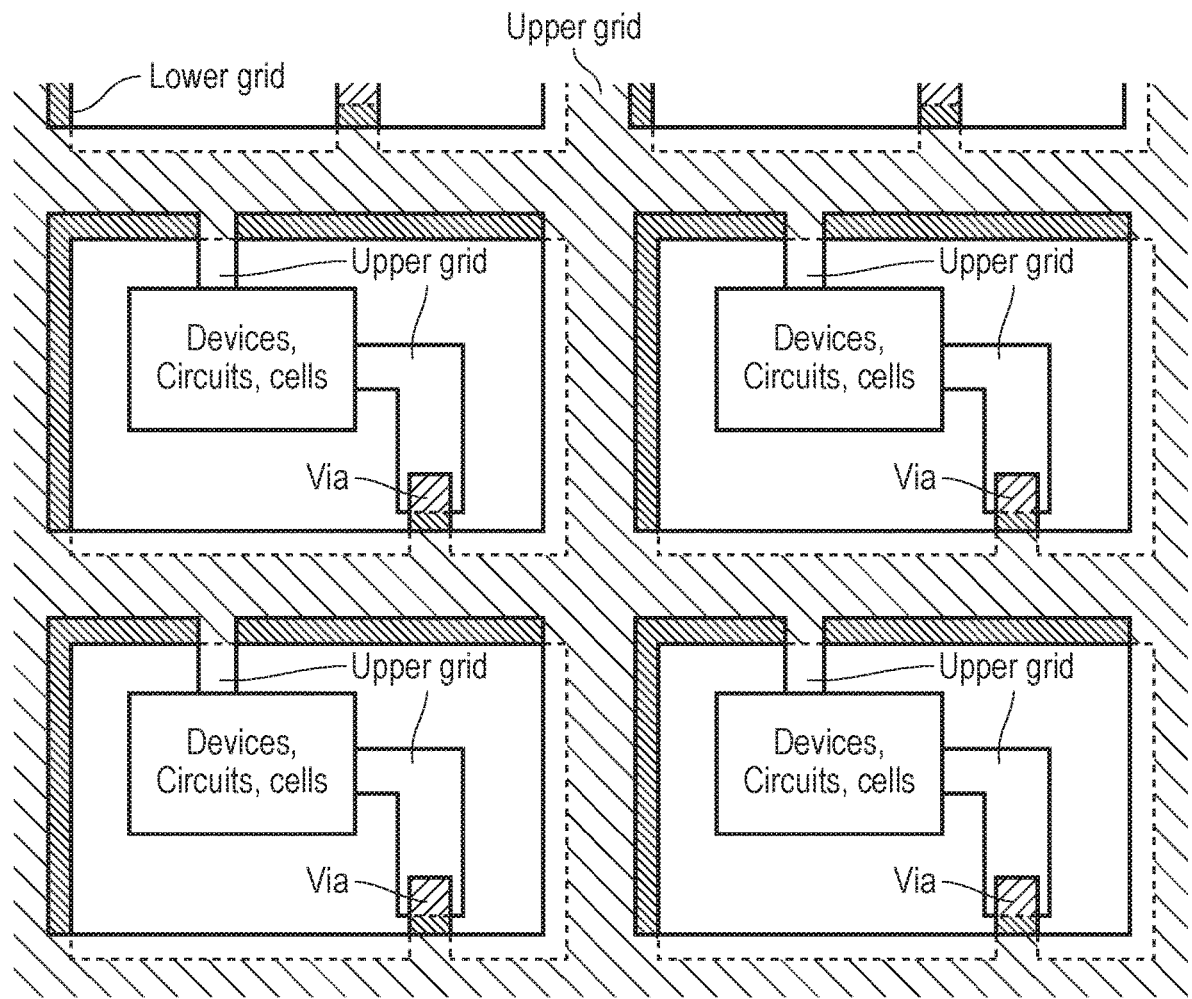
Figure 14D:
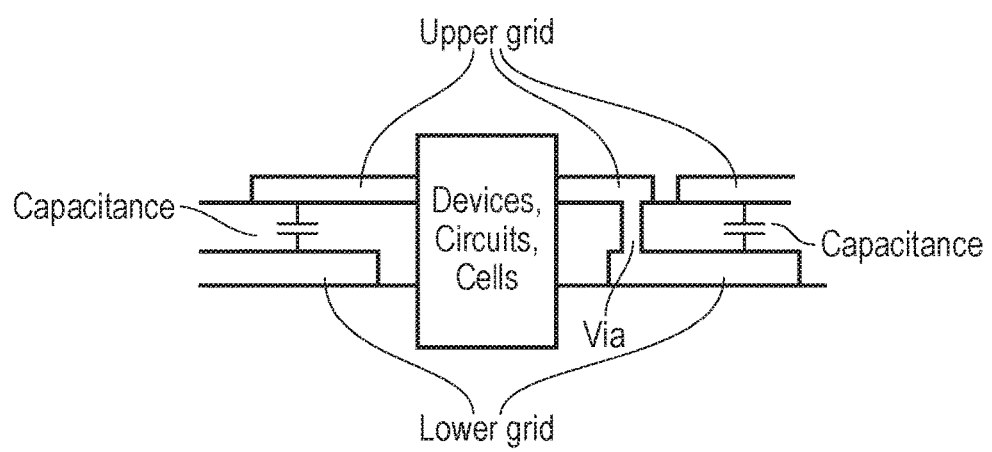
Figure 14E:
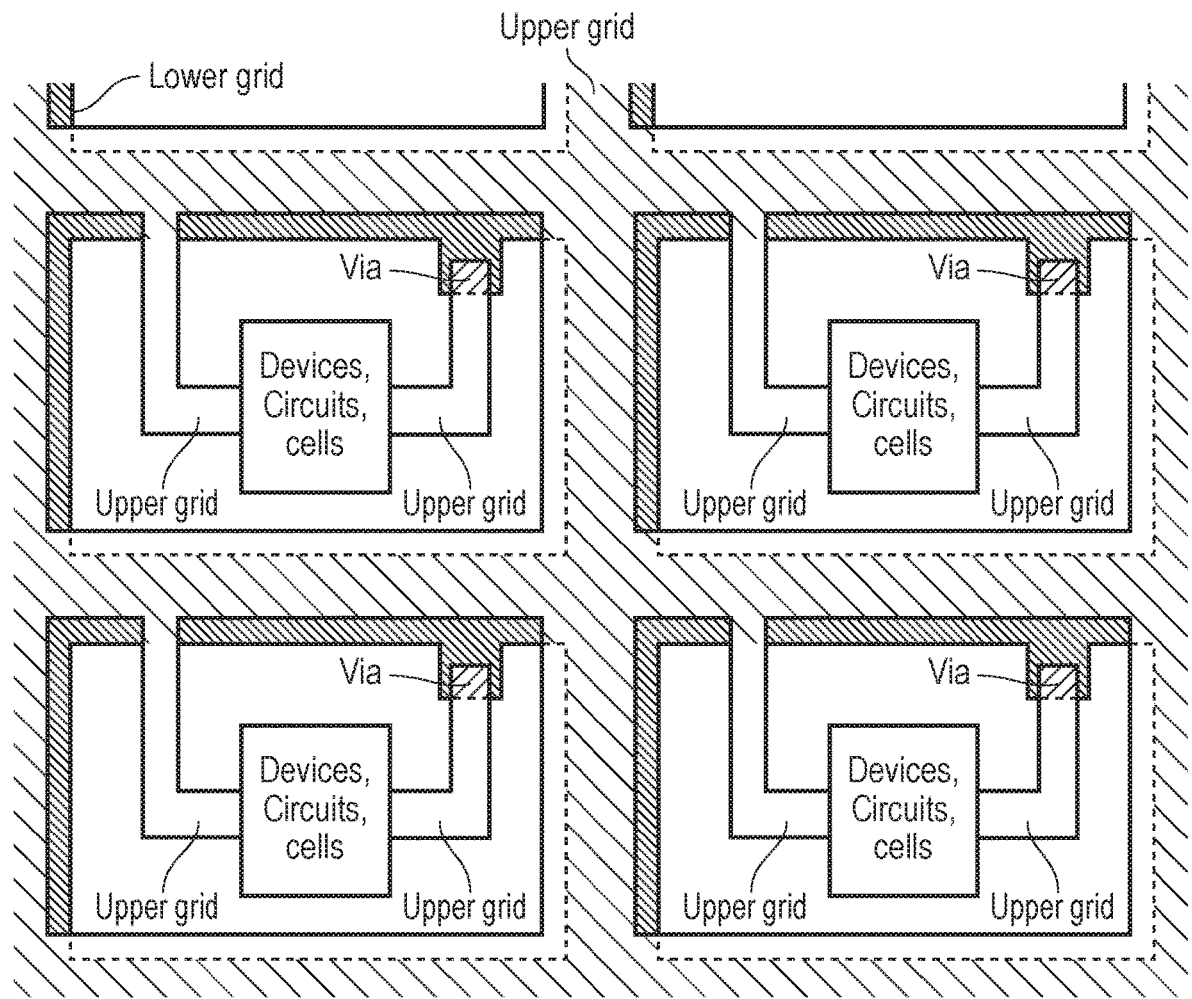
Figure 14E:
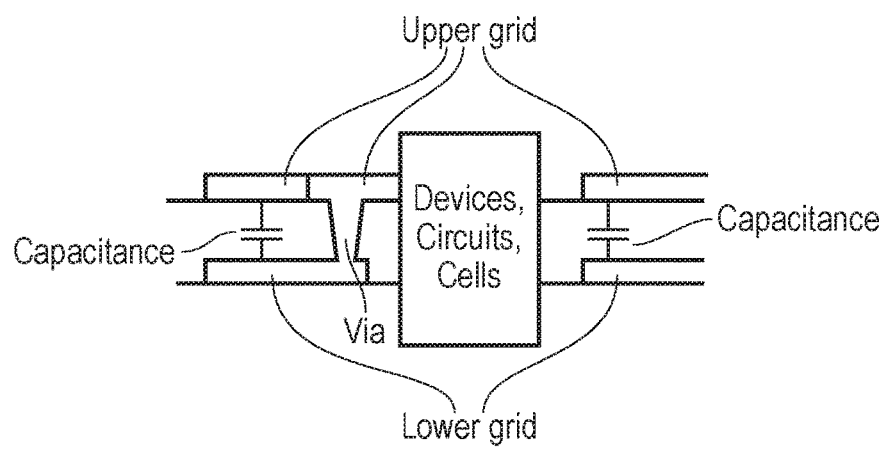

Furthermore, in electronic circuits incorporating the power rail grid/mesh structure shown in FIG. 14, layout and routing may be simplified since all cells may share the same orientation. Example approaches to layout are illustrated in FIGS. 14b, 14c, 14d and 14e which show an offset plan view and a cross section for each approach. In these figures the upper grid and lower grid are separated by a layer of dielectric material, which for purposes of clarity is not shown. In FIG. 14b, connections from each power grid to circuit cells or devices may project from the grid on different sides of each window between cross members. In the specific example of FIG. 14b power rail connections from the upper grid project from the top side of the grid window, whilst power rail connections from the lower grid project from the bottom side of the window. Alternatively, as shown in FIG. 14c, connections from each power grid to circuit cells or devices may project from the grid on the same side of each window between cross members. In the specific example of FIG. 14c power rail connections from both upper and lower grids project from the top side of the grid window. In further examples, connections from any one grid may be made from more than one side of a window. In both approaches of FIGS. 14b and 14c, both power rails are coupled into the devices, circuits or cells in the lower grid. It may be more appropriate in some cases to couple the power rails into devices, circuits or cells in the upper grid, as illustrated in FIGS. 14d and 14e. In FIG. 14d, power rail connections from the upper grid project from the top side of the grid window, whilst power rail connections from the lower grid project from the bottom side of the window. FIG. 14e shows connections from each power grid to circuit cells or devices projecting from the grid on the same side of each window between cross members. In further examples, connections from any one grid may be made from more than one side of a window. The specifics of the layout may reflect the requirements of the design and application. Electronic circuits incorporating the power rail grid/mesh structure shown in FIGS. 14 to 14e may also add an advantage in increasing the capacitance between these power rails locally to the cells of the circuit, which improves switching noise reduction. In other words, circuit elements may have overlapping/coincident first and second rail portions 11, 12 close to them, rather than capacitance provided remotely.

In certain embodiments, high capacitance is provided between the power rails by routing one rail in the FET (e.g. TFT) source-drain layer and the other power rail (or line) in the FET gate layer, with, for example, an aluminium oxide high-k dielectric between them.

It will be appreciated that the capacitance C of a capacitor is given by the equation: $C=eA/d$ ($C$=capacitance, $e$=dielectric permittivity constant, $A$=area of parallel plates, and $d$=separation of parallel plates). Thus, a higher capacitance is provided by using a dielectric of higher permittivity constant, a larger plate area, and smaller plate separation.

Embodiments of the present invention, by increasing capacitance between the power rails and optionally providing that additional capacitance in a distributed form, have multiple positive effects, including:

the circuit is more robust to ESD events
input noise along the power rails is reduced
resistance to internal dynamic IR drops is improved, and
noise cross-talk between the gates is reduced.

Figure 15:
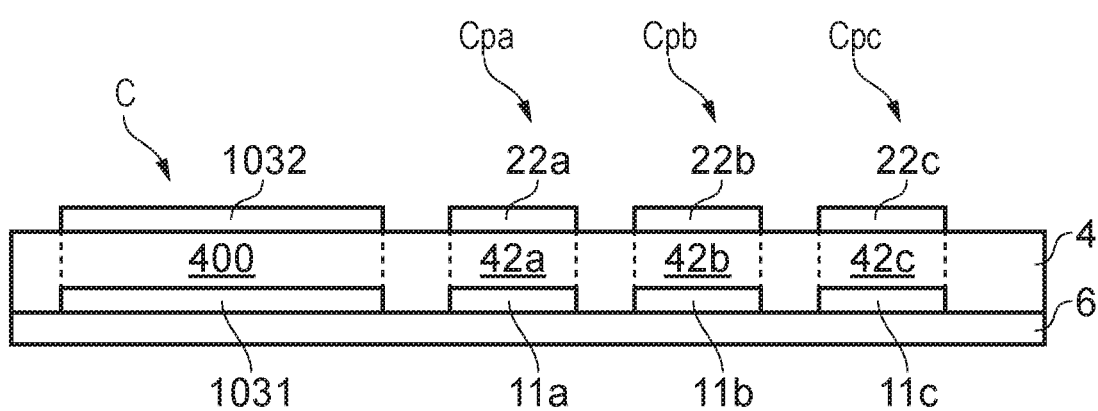
FIG. 15 is a schematic cross section of part of another electronic circuit embodying the invention.

Referring now to FIG. 15, this illustrates a cross section of part of another electronic circuit embodying the invention. Here, the circuit comprises a capacitor C, arranged, for example, for smoothing purposes to smooth the supply voltage between the power rails, and formed from capacitor plates 1031 and 1032 separated by a portion 400 of a layer of dielectric material 4. The circuit further comprises a power rail structure comprising a plurality of first power rail portions 11a-11c and a plurality of second rail portions 22a-22c. Each of the second rail portions 22 is arranged above a respective corresponding first rail portion 11 to provide, together with a respective portion 42 of the dielectric layer sandwiched between them, a respective power rail capacitance Cp to the circuit. In certain embodiments, each of the first rail portions 11a-11c may be part of a mesh or grid of the first power rail, and each of the second rail portions 22a-22c may be part of a second power rail mesh or grid, for example such as those shown in FIG. 14. In certain embodiments, the dielectric layer 4 which provides the capacitor dielectrics, also provides the gate dielectric of one or more FETs in the electronic circuit. Thus, at least the power grid capacitance may share the same dielectric material as one or more active devices in the circuit. Thus, the total capacitance between the power rails in certain electronic circuits embodying the invention may be shared and distributed between a dedicated capacitor and the power rails, and the power rail capacitance may be distributed over an area in which one or more active devices are located.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. An electronic circuit comprising:
    a first power rail;
    a second power rail; and
    a field effect transistor, FET, comprising:
        a first terminal coupled directly or indirectly to the first power rail;
        a second terminal coupled directly or indirectly to the second power rail;
        a channel of semiconductive material connecting the first terminal to the second terminal;
        a gate terminal to which a voltage may be applied to control a conductivity of said channel, said channel providing a conduction path from the first terminal to the second terminal; and
        a gate dielectric arranged to insulate the gate terminal from said channel,
    wherein said electronic circuit comprises a layer or other body of dielectric material, said gate dielectric being a first portion of the layer or other body of dielectric material, and in that the first power rail comprises a first rail portion arranged on a first side of a second portion of the layer or other body of dielectric material, and the second power rail comprises a second rail portion arranged on a second side of the second portion of the layer or other body of dielectric material, said second side being opposite said first side, whereby said second portion of the layer or other body of dielectric material separates said first and second rail portions and with said first and second rail portions providing a capacitance to said circuit.

2. The circuit in accordance with claim 1, wherein the other body of dielectric material is a layer.

3. The circuit in accordance with claim 2, wherein said layer has a thickness in the range 1 nm to 500 nm.

4. The circuit in accordance with claim 1, wherein said dielectric material has a dielectric constant greater than 3.9.

5. The circuit in accordance with claim 1, wherein said FET is a thin film transistor.

6. The circuit in accordance with claim 1, wherein said first and second terminals and said first rail portion are each substantially flat and coplanar with one another.

7. The circuit in accordance with claim 6, wherein said first terminal is directly connected to said first rail portion.

8. The circuit in accordance with claim 7, wherein said first terminal and said first rail portion are respective portions of a flat layer or other body of conductive material.

9. The circuit in accordance with claim 1, wherein said gate terminal and said second rail portion are each substantially flat and coplanar with one another.

10. The circuit in accordance with claim 1, wherein said first rail portion is in direct contact with said first side.

11. The circuit in accordance with claim 1, wherein said second rail portion is in direct contact with said second side.

12. The circuit in accordance with claim 1, further comprising an antenna arranged to receive a wireless signal, rectifying means connected to the antenna and to the first and second power rails and arranged to generate a DC voltage between said first and second power rails from a received wireless signal.

13. The circuit in accordance with claim 12, further comprising a capacitor connected between said first and second power rails to smooth said DC voltage.

14. The circuit in accordance with claim 1, wherein the circuit comprises a layer of semiconductive material, said first and second terminals and said first rail portion are formed on a first surface of the layer of semiconductive material, said channel being provided by a portion of the layer of semiconductive material, the layer or other body of dielectric material is formed over the first and second terminals and said first rail portion, and said gate terminal and second rail portion are formed on a first surface of the layer or other body of dielectric material.

15. The circuit in accordance with claim 14, further comprising a substrate under the layer of semiconductive material.

16. The circuit in accordance with claim 1, further comprising a substrate and a layer of semiconductive material, wherein said first and second terminals and said first rail portion are formed on a first surface of the substrate, said layer of semiconductive material is formed over the first and second terminals and said first rail portion, the layer or other body of dielectric material is formed over the layer of semiconductive material, and said gate terminal and second rail portion are formed on a first surface of the layer or other body of dielectric material.

17. The circuit in accordance with claim 1, further comprising a substrate and a layer of semiconductive material, wherein said first and second terminals and said first rail portion are formed on a first surface of the substrate, said layer of semiconductive material is formed at least between the first and second terminals to provide said channel, the layer or other body of dielectric material is formed over the layer of semiconductive material and the first and second terminals and the first rail portion, and said gate terminal and second rail portion are formed on a first surface of the layer or other body of dielectric material.

18. The circuit in accordance with claim 1, further comprising a substrate and a layer of semiconductive material, wherein said gate terminal and said second rail portion are formed on a first surface of the substrate, the layer or other body of dielectric material of is formed over the gate terminal and said second rail portion, said first and second terminals and said first rail portion are formed over the layer or other body of dielectric material, and said layer of semiconductive material is formed at least between the first and second terminals to provide said channel.

19. The circuit in accordance with claim 1, further comprising a substrate and a layer of semiconductive material, wherein said gate terminal and said second rail portion are formed on a first surface of the substrate, the layer or other body of dielectric material is formed over the gate terminal and said second rail portion, said layer of semiconductive material is formed over at least a portion of the layer or body of dielectric material covering the gate terminal, and said first and second terminals and said first rail portion are formed over the layer of semiconductive material and the layer or other body of dielectric material.

20. An electronic circuit comprising:
    a first power rail;
    a second power rail; and a layer or other body of dielectric material,
wherein the first power rail comprises a first rail portion arranged on a first side of the layer or other body of dielectric material, and the second power rail comprises a second rail portion arranged on a second side of the layer or other body of dielectric material, said second side being opposite said first side, said first rail portion comprising a first grid or mesh of crossing and intersecting conductive elements and said second rail portion comprising a second grid or mesh of crossing and intersecting conductive elements, said first and second grids or meshes of crossing and intersecting conductive elements having substantially the same shape and being aligned with one another, on said opposite first and second sides, so as to form, together with a portion of the layer or other body of dielectric material sandwiched between them, a capacitor.

21. The electronic circuit in accordance with claim 20, and further comprising a field effect transistor comprising:
   a first terminal coupled directly or indirectly to the first power rail;
   a second terminal coupled directly or indirectly to the second power rail;
   a channel of semiconductive material connecting the first terminal to the second terminal;
   a gate terminal to which a voltage may be applied to control a conductivity of said channel, said channel providing a conduction path from the first terminal to the second terminal; and
   a gate dielectric arranged to insulate the gate terminal from said channel,
   wherein said gate dielectric comprises a portion of the layer or other body of dielectric material.

22. The electronic circuit in accordance with claim 20, comprising a further capacitor connected between said power rails, said further capacitor comprising a first capacitor plate, connected to the first power rail, and arranged on said first side, a second capacitor plate, connected to the second power rail, and arranged on said second side, and a further portion of the layer or other body of dielectric material, said further portion being a portion located between said first and second capacitor plates.

23. The circuit in accordance with claim 20, further comprising an antenna arranged to receive a wireless signal, rectifying means connected to the antenna and to the first and second power rails and arranged to generate a DC voltage between said first and second power rails from a received wireless signal.

24. A method of manufacturing an electronic circuit comprising a first power rail, a second power rail, and a field effect transistor, FET, comprising a first terminal coupled directly or indirectly to the first power rail, a second terminal coupled directly or indirectly to the second power rail, a channel of semiconductive material connecting the first terminal to the second terminal, a gate terminal to which a voltage may be applied to control a conductivity of said channel, said channel providing a conduction path from the first terminal to the second terminal; and a gate dielectric arranged to insulate the gate terminal from said channel, wherein said electronic circuit comprises a layer or other body of dielectric material, said gate dielectric being a first portion of the layer or other body of dielectric material, and in that the first power rail comprises a first rail portion arranged on a first side of a second portion of the layer or other body of dielectric material, and the second power rail comprises a second rail portion arranged on a second side of the second portion of the layer or other body of dielectric material, said second side being opposite said first side, whereby said second portion of the layer or other body of dielectric material separates said first and second rail portions and with said first and second rail portions providing a capacitance to said circuit,
   the method comprising:
   forming the layer or other body of dielectric material comprising the first portion and the second portion;
   forming the first and second terminals and the first rail portion of the first power rail at the same time on the first side of the layer or other body of dielectric material;
   forming the gate terminal and the second rail portion of the second power rail at the same time on the second side of the layer or other body of dielectric material,
   wherein the first and second rail portions are positioned on opposite sides of said second portion so as to form, together with said second portion, a capacitor,
   and wherein said gate terminal and first and second terminals are positioned such that said first portion provides said gate dielectric.

25. The method in accordance with claim 24, wherein:
said forming of the first and second terminals and first rail portion is performed before forming said the layer or other body of dielectric material, and said forming of the gate terminal and second rail portion is performed after forming the layer or other body of dielectric material;
or
said forming of the first and second terminals and first rail portion is performed after forming said the layer or other body of dielectric material, and said forming of the gate terminal and second rail portion is performed before forming said the layer or other body of dielectric material.

* * * * *